(12) United States Patent
Ong et al.

(10) Patent No.: US 12,413,230 B2
(45) Date of Patent: Sep. 9, 2025

(54) LEVEL SHIFTING CIRCUIT

(71) Applicant: eMemory Technology Inc., Hsin-Chu (TW)

(72) Inventors: Wei-Chiang Ong, Hsinchu County (TW); Cheng-Yu Chung, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 11 days.

(21) Appl. No.: 18/660,251

(22) Filed: May 10, 2024

(65) Prior Publication Data

US 2025/0023567 A1    Jan. 16, 2025

Related U.S. Application Data

(60) Provisional application No. 63/526,481, filed on Jul. 13, 2023.

(51) Int. Cl.
| | | |
|---|---|---|
| H03K 19/0185 | (2006.01) | |
| H03K 3/012 | (2006.01) | |
| H03K 3/356 | (2006.01) | |

(52) U.S. Cl.
CPC ..... *H03K 19/018521* (2013.01); *H03K 3/012* (2013.01); *H03K 3/356113* (2013.01)

(58) Field of Classification Search
CPC .......... H03K 19/018521; H03K 3/012; H03K 3/356113; H02M 3/158
See application file for complete search history.

(56) References Cited

U.S. PATENT DOCUMENTS

| | | | |
|---|---|---|---|
| 6,803,801 B2 | 10/2004 | Randazzo et al. | |
| 10,483,962 B2 | 11/2019 | Shin | |
| 11,005,460 B1* | 5/2021 | Abesingha | H03K 3/013 |
| 2010/0026343 A1* | 2/2010 | Yang | H03K 19/01855 326/80 |
| 2020/0313668 A1* | 10/2020 | Yu | H03K 19/0185 |
| 2023/0298657 A1* | 9/2023 | Chang | G11C 11/4072 |

FOREIGN PATENT DOCUMENTS

TW            I739695 B      9/2021

* cited by examiner

*Primary Examiner* — Sibin Chen
(74) *Attorney, Agent, or Firm* — WPAT, PC

(57) ABSTRACT

A level shifting circuit includes a first-type level shifter, a second-type level shifter and a controller. The controller is connected to the output terminal of the first-type level shifter and the output terminal of the second-type level shifter. The level shifting circuit can be operated in different modes. In a standby mode, the logic level state of an output signal from the level shifting circuit is determined according to the logic level state of a shifted signal from the first-type level shifter. In a non-standby mode, the logic level state of the output signal from the level shifting circuit is determined according to the logic level state of a shifted signal from the second-type level shifter.

21 Claims, 8 Drawing Sheets

LEVEL SHIFTING CIRCUIT

This application claims the benefit of U.S. provisional application Ser. No. 63/526,481, filed Jul. 13, 2023, the subject matters of which are incorporated herein by references.

FIELD OF THE INVENTION

The present invention relates to a level shifting circuit, and more particularly to a level shifting circuit that is operable in different modes.

BACKGROUND OF THE INVENTION

Generally, an IC chip has different power domains. The circuits in different power domains receive different power supply voltages. For example, a first power domain has a power supply voltage Vdd1, and a second power domain has a power supply voltage Vdd2. The power supply voltage Vdd1 and the power supply voltage Vdd2 are different. In addition, the signals between different power domains need to be converted into the desired voltage levels by a level shifter. Consequently, the circuits in different power domains can be in communication with each other normally.

For example, as for the operating signals associated with the circuits in the first power domain, the logic high level is the power supply voltage Vdd1, and the logic low level is a ground voltage GND. As for the operating signals associated with the circuits in the second power domain, the logic high level is the power supply voltage Vdd2, and the logic low level is the ground voltage GND.

By the level shifter, the logic high level in the first power domain (i.e., Vdd1) can be converted into the logic high level in the second power domain (i.e., Vdd2). Similarly, by the level shifter, the logic low level in the first power domain (i.e., GND) can be converted into the logic low level in the second power domain (i.e., GND).

In order to reduce the power consumption of the IC chip, the IC chip can provide various mode signals to set different modes according to the operating situation. For example, a standby signal is a mode signal. When the standby signal is in a first logic level state, the IC chip is in a standby mode. When the standby signal is in a second logic level state, the IC chip is in a non-standby mode, which is also known as a chip enable mode.

In the standby mode, the standby signal is in the first logic level state. In this situation, only few circuits in the first power domain with the lower power supply voltage Vdd1 are enabled. In addition, the standby signal is transmitted to the second power domain with the higher power supply voltage Vdd2 through the level shifter. Consequently, the circuits in the second power domain are disabled.

In the non-standby mode, the standby signal is in the second logic level state. In this situation, the circuits in the first power domain with the lower power supply voltage Vdd1 are normally operated. In addition, the standby signal is transmitted to the second power domain with the higher power supply voltage Vdd2 through the level shifter. Consequently, the circuits in the second power domain are operated normally.

SUMMARY OF THE INVENTION

An embodiment of the present invention provides a level shifting circuit. The level shifting circuit has a first input terminal and a first output terminal. The first input terminal of the level shifting circuit receives a first mode signal in a first power domain. The first output terminal of the level shifting circuit generates a shifted first mode signal in a second power domain different from the first power domain. The level shifting circuit includes a first first-type level shifter, a first second-type level shifter and a controller. An input terminal of the first first-type level shifter is coupled to the first input terminal of the level shifting circuit. The input terminal of the first first-type level shifter receives the first mode signal. An output terminal of the first first-type level shifter outputs a first shifted signal in the second power domain. An input terminal of the first second-type level shifter is coupled to the first input terminal of the level shifting circuit. The input terminal of the first second-type level shifter receives the first mode signal. An output terminal of the first second-type level shifter outputs a second shifted signal in the second power domain. The first second-type level shifter includes a first bias circuit. The first bias circuit receives at least one bias voltage for operating normally. The controller is coupled to the output terminal of the first first-type level shifter and the output terminal of the first second-type level shifter. In a standby mode, the first mode signal is in a first logic level state, the first second-type level shifter is disabled by the controller, and the controller does not provide the at least one bias voltage to the first bias circuit of the first second-type level shifter. According to the first shifted signal in the first logic level state, the controller outputs the shifted first mode signal in the first logic level state. In a non-standby mode, the first mode signal is in a second logic level state, the first shifted signal from the first first-type level shifter is ignored by the controller, and the controller provides the at least one bias voltage to the first bias circuit of the first second-type level shifter. According to the second shifted signal in the second logic level state, the controller outputs the shifted first mode signal in the second logic level state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a level shifting circuit. The level shifting circuit can be operated in different modes. In an embodiment, the level shifting circuit comprises at least two types of level shifters, including a first-type level shifter and a second-type level shifter. The first-type level shifter is not equipped with a bias circuit. The second-type level shifter is equipped with a bias circuit. Hereinafter, some exemplary level shifters will be described as follows.

Figure 1:
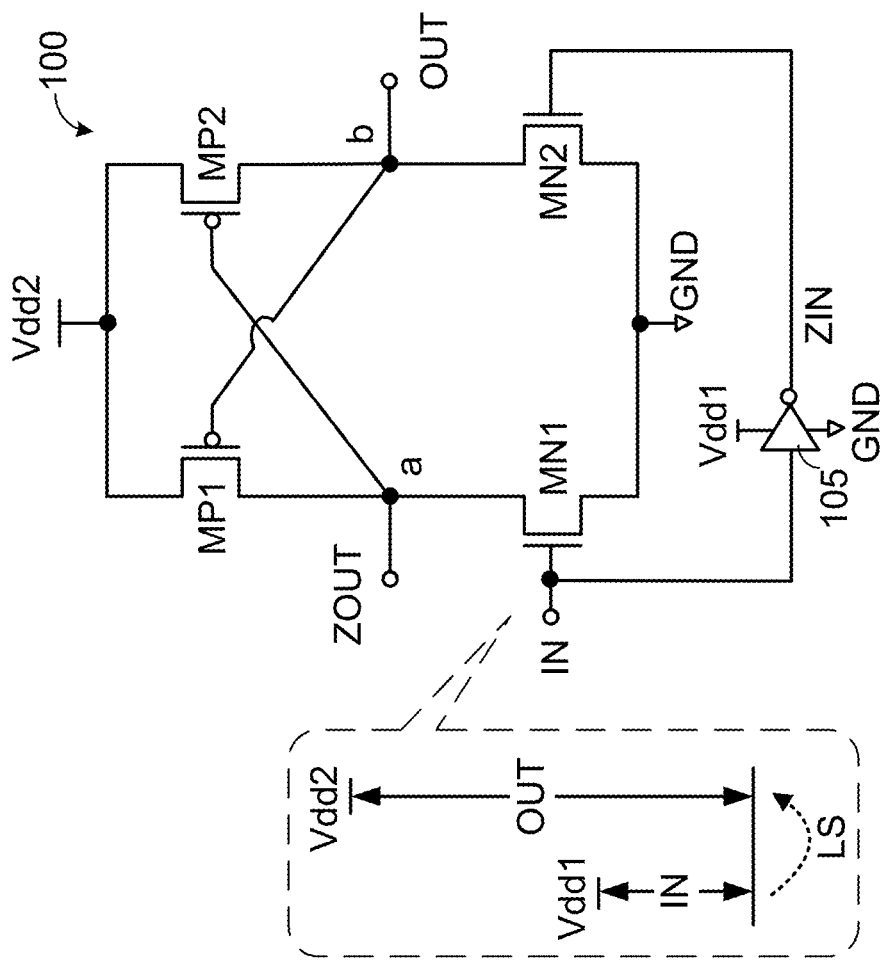
FIG. 1 is a schematic circuit diagram illustrating an example of a first-type level shifter.

FIG. 1 is a schematic circuit diagram illustrating an example of a first-type level shifter. By the first-type level shifter 100, an input signal IN and an inverted input signal ZIN in the range between a voltage Vdd1 and a voltage GND are converted into an output voltage OUT and an inverted output voltage ZOUT in the range between a voltage Vdd2 and the voltage GND. The voltage Vdd1 is a power supply voltage (e.g., 1V), the voltage Vdd2 is another power supply voltage (e.g., 5V) higher than the voltage Vdd1, and the voltage GND is a ground voltage (e.g., 0V). The input signal IN and the inverted input signal ZIN are complementary signals. The output voltage OUT and the inverted output voltage ZOUT are complementary signals.

As shown in FIG. 1, the first-type level shifter 100 comprises an inverter 105, a P-type transistor MP1, a P-type transistor MP2, an N-type transistor MN1, and an N-type transistor MN2. In addition, the first-type level shifter 100 at least comprises an input terminal and an output terminal. The input terminal of the first-type level shifter 100 receives the input signal IN. The output terminal of the first-type level shifter 100 generates the output voltage OUT.

The inverter 105 is connected with the power supply voltage Vdd1 and the ground voltage GND. The input terminal of the inverter 105 is connected with the input terminal of the first-type level shifter 100 to receive the input signal IN. The output terminal of the inverter 105 generates the inverted input signal ZIN.

The source terminal of the P-type transistor MP1 receives the power supply voltage Vdd2. The drain terminal of the P-type transistor MP1 is connected with a node "a". The gate terminal of the P-type transistor MP1 is connected with a node "b". The source terminal of the P-type transistor MP2 receives the power supply voltage Vdd2. The drain terminal of the P-type transistor MP2 is connected with the node "b". The gate terminal of the P-type transistor MP2 is connected with the node "a".

The drain terminal of the N-type transistor MN1 is connected with the node "a". The source terminal of the N-type transistor MN1 receives the ground voltage GND. The gate terminal of the N-type transistor MN1 receives the input signal IN. The drain terminal of the N-type transistor MN2 is connected with the node "b". The source terminal of the N-type transistor MN2 receives the ground voltage GND. The gate terminal of the N-type transistor MN2 receives the inverted input signal ZIN. The node "b" is connected with the output terminal of the first-type level shifter 100 to generate the output signal OUT. The node "a" is served as another output terminal of the first-type level shifter 100 to generate the inverted output signal ZOUT.

In case that the input signal IN is in a logic high level state corresponding to the power supply voltage Vdd1 and the inverted input signal ZIN is in a logic low level state (e.g., 0V), the N-type transistor MN1 and the P-type transistor MP2 are turned on, and the N-type transistor MN2 and the P-type transistor MP1 are turned off. Consequently, the output signal OUT is in the logic high level state corresponding to the power supply voltage Vdd2, and the inverted output signal ZOUT is in the logic low level state (e.g., 0V).

In case that the input signal IN is in the logic low level state (e.g., 0V) and the inverted input signal ZIN is in the logic high level state corresponding to the power supply voltage Vdd1, the N-type transistor MN1 and the P-type transistor MP2 are turned off, and the N-type transistor MN2 and the P-type transistor MP1 are turned on. Consequently, the output signal OUT is in the logic low level state (e.g., 0V), and the inverted output signal ZOUT is in the logic high level state corresponding to the power supply voltage Vdd2.

As mentioned above, by the first-type level shifter 100, the logic high level of the power supply voltage Vdd1 can be converted into the logic high level of the power supply voltage Vdd2. Similarly, the logic low level of the ground voltage GND can be converted into the logic low level of the ground voltage GND. In other words, the output signal OUT is a shifted signal of the input signal IN.

Figure 2A:
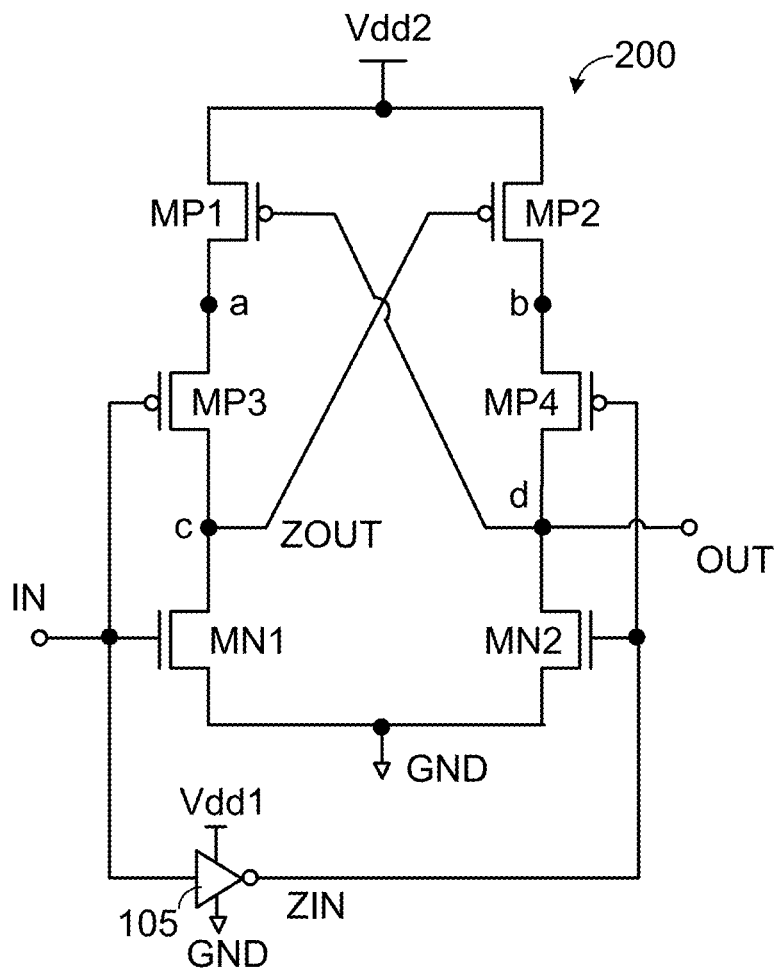
FIG. 2A is a schematic circuit diagram illustrating another example of the first-type level shifter.

FIG. 2A is a schematic circuit diagram illustrating another example of the first-type level shifter. As shown in FIG. 2A, the first-type level shifter 200 comprises an inverter 105, a P-type transistor MP1, a P-type transistor MP2, a P-type transistor MP3, a P-type transistor MP4, an N-type transistor MN1 and an N-type transistor MN2. The first-type level shifter 200 at least comprises an input terminal and an output terminal. The input terminal of the first-type level shifter 200 receives the input signal IN. The output terminal of the first-type level shifter 200 generates an output signal OUT.

The inverter 105 is connected with the power supply voltage Vdd1 and the ground voltage GND. The input terminal of the inverter 105 is connected with the input terminal of the first-type level shifter 200 to receive the input signal IN. The output terminal of the inverter 105 generates an inverted input signal ZIN.

The source terminal of the P-type transistor MP1 receives the power supply voltage Vdd2. The drain terminal of the P-type transistor MP1 is connected with a node "a". The gate terminal of the P-type transistor MP1 is connected with a node "d". The source terminal of the P-type transistor MP2 receives the power supply voltage Vdd2. The drain terminal of the P-type transistor MP2 is connected with the node "b". The gate terminal of the P-type transistor MP2 is connected with a node "c". The source terminal of the P-type transistor MP3 is connected with the node "a". The drain terminal of the P-type transistor MP3 is connected with the node "c". The gate terminal of the P-type transistor MP3 receives the input signal IN. The source terminal of the P-type transistor MP4 is connected with the node "b". The drain terminal of the P-type transistor MP4 is connected with the node "d". The gate terminal of the P-type transistor MP4 receives the inverted input signal ZIN.

The drain terminal of the N-type transistor MN1 is connected with the node "c". The source terminal of the N-type transistor MN1 receives the ground voltage GND.

The gate terminal of the N-type transistor MN1 receives the input signal IN. The drain terminal of the N-type transistor MN2 is connected with the node "d". The source terminal of the N-type transistor MN2 is connected with the ground voltage GND. The gate terminal of the N-type transistor MN2 receives the inverted input signal ZIN. The node "d" is connected with the output terminal of the first-type level shifter 200 to generate the output signal OUT. The node "c" is served as another output terminal of the first-type level shifter 200 to generate an inverted output signal ZOUT.

In case that the input signal IN of the first-type level shifter 200 is in a logic high level state corresponding to the power supply voltage Vdd1 and the inverted input signal ZIN is in a logic low level state (e.g., 0V), the N-type transistor MN1, the P-type transistor MP2 and the P-type transistor MP4 are turned on, and the N-type transistor MN2, the P-type transistor MP1 and the P-type transistor MP3 are turned off. Consequently, the output signal OUT is in the logic high level state corresponding to the power supply voltage Vdd2, and the inverted output signal ZOUT is in the logic low level state (e.g., 0V).

In case that the input signal IN of the first-type level shifter 200 is in the logic low level state (e.g., 0V) and the inverted input signal ZIN is in the logic high level state corresponding to the power supply voltage Vdd1, the N-type transistor MN1, the P-type transistor MP2 and the P-type transistor MP4 are turned off, and the N-type transistor MN2, the P-type transistor MP1 and the P-type transistor MP3 are turned on. Consequently, the output signal OUT is in the logic low level state (e.g., 0V), and the inverted output signal ZOUT is in the logic high level state corresponding to the power supply voltage Vdd2. That is, the output signal OUT is the shifted signal of the input signal IN.

Nowadays, the CMOS manufacturing process is selected according to the operating voltage range of the transistors. For example, the CMOS manufacturing process for a medium voltage device (MV device) is used to fabricate a transistor capable of withstanding a higher voltage stress. Since the magnitude of the threshold voltage of this transistor is higher, this transistor is suitable for the medium voltage operation. In addition, the CMOS manufacturing process for a low voltage device is used to fabricate a transistor capable of withstanding a lower voltage stress. Since the magnitude of the threshold voltage of this transistor is lower, this transistor is suitable for the low voltage operation. For example, in the medium voltage operation, the voltage stress that can be withstood by the medium voltage transistor is in the range between 3.0V and 10V. Moreover, in the low voltage operation, the voltage stress that can be withstood by the low voltage transistor is in the range between 0.8V and 2.0V.

Please refer to the first-type level shifter 200 of FIG. 2A again. When the N-type transistor MN1 is turned off, the voltage stress between the drain terminal and the source terminal of the N-type transistor MN1 is the power supply voltage Vdd2 (i.e., 5V). Similarly, when the N-type transistor MN2 is turned off, the voltage stress between the drain terminal and the source terminal of the N-type transistor MN2 is the power supply voltage Vdd2 (i.e., 5V). In other words, the transistors of the first-type level shifter 200 need to be specially designed. For example, the two N-type transistors MN1 and MN2 are medium voltage devices to withstand the higher voltage stress, and the four P-type transistors MP1~MP4 are also medium voltage devices. Similarly, in the first-type level shifter 100 of FIG. 1, the two N-type transistors MN1 and MN2 and the two P-type transistors MP1 and MP2 are medium voltage devices to withstand the higher voltage stress.

Figure 2B:
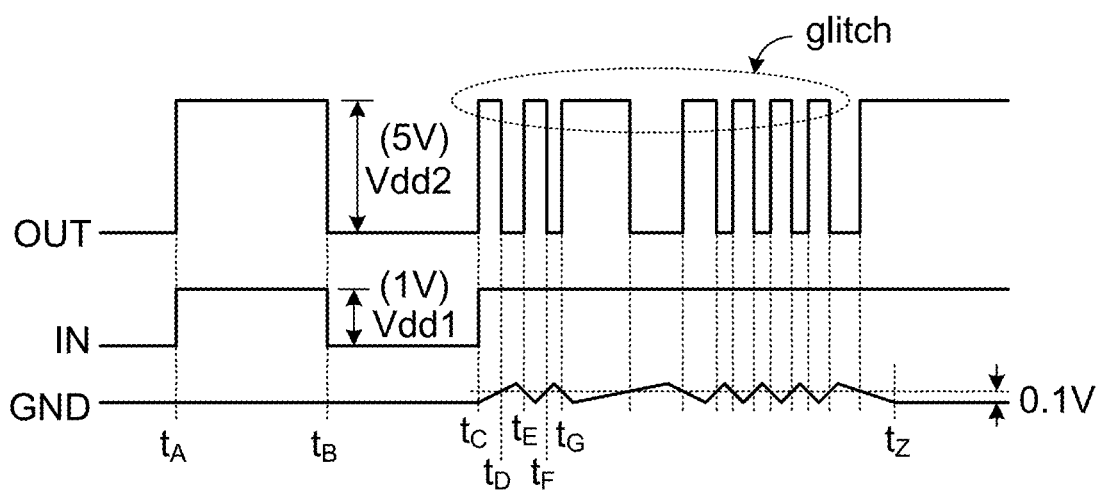
FIG. 2B is a schematic timing waveform diagram illustrating associated signals of the first-type level shifter as shown in FIG. 2A when the malfunction of the first-type level shifter occurs.

However, when the power supply voltage Vdd1 is set to a lower voltage and is very close to the threshold voltages of MN1 and MN2, using medium voltage devices to design the level shifter may result in malfunction of the level shifter due to the ground disturbance. FIG. 2B is a schematic timing waveform diagram illustrating associated signals of the first-type level shifter as shown in FIG. 2A when the malfunction of the first-type level shifter occurs. In the first-type level shifter 200, the logic high level of the first power domain is the power supply voltage Vdd1 (e.g., 1V), and the N-type transistors MN1 and MN2 are medium voltage devices. Each of the N-type transistors MN1 and MN2 has a higher threshold voltage Vt1 (e.g., 0.9V). In other words, the logic high level Vdd1 (e.g., 1V) of the first power domain is slightly higher than the threshold voltage Vt1 (e.g., 0.9V) of the N-type transistor MN1 (or the N-type transistor MN2).

Please refer to FIG. 2B again. At the time point $t_A$, the gate terminal of the N-type transistor MN1 receives the input signal IN in the logic high level state (Vdd1), and the source terminal of the N-type transistor MN1 receives the ground voltage GND (0V). The gate-source voltage $V_{GS}$ of the N-type transistor MN1 is 1V (i.e., 1V−0V=1V), which is higher than the threshold voltage Vt1 (0.9V). Consequently, the N-type transistor MN1 is turned on, and the output signal OUT is in the logic high level state (Vdd2).

At the time point $t_B$, the gate terminal of the N-type transistor MN1 receives the input signal IN in the logic low level state (0V). The gate-source voltage $V_{GS}$ of the N-type transistor MN1 is 0V (i.e., 0V−0V=0V), which is lower than the threshold voltage Vt1 (0.9V). Consequently, the N-type transistor MN1 is turned off, and the output signal OUT is in the logic low level state (0V).

In case that the total current generated during the operation of the IC chip is larger, the ground voltage GND is possibly subjected to disturbance. Please refer to FIG. 2B again. After time point $t_C$, the gate terminal of the N-type transistor MN1 receives the input signal IN in the logic high level state (Vdd1). Theoretically, the output signal OUT should be in the logic high level state (Vdd2).

However, since the ground voltage GND is subjected to disturbance in the time interval between the time point $t_C$ and the time point $t_Z$, the ground voltage GND will change up and down. For example, the ground voltage GND changes between 0V and 0.2V. In the time interval between the time point $t_D$ and the time point $t_E$, the increase of the ground voltage GND is larger than 0.1V. The gate-source voltage $V_{GS}$ of the N-type transistor MN1 is lower than 0.9V, i.e., lower than the threshold voltage Vt1 (0.9V). Consequently, the N-type transistor MN1 is turned off, causing node c is floating and possibly couple to a high level state by other signal which in turn affects the output signal OUT and may couple to the logic low level state (0V). In the time interval between the time point $t_E$ and the time point $t_F$, the ground voltage GND is lower than 0.1V. The gate-source voltage $V_{GS}$ of the N-type transistor MN1 is higher than 0.9V, i.e., higher than the threshold voltage Vt1 (0.9V). Consequently, the N-type transistor MN1 is turned on, and the output signal OUT is in the logic high level state (Vdd2). Since the output signal OUT generates the glitch in the time interval between the time point $t_C$ and the time point $t_Z$, the malfunction of the first-type level shifter 200 occurs.

As mentioned above, the N-type transistors MN1 and MN2 in each of the first-type level shifters 100 and 200 are medium voltage devices with higher threshold voltage. In case that the ground voltage GND in the IC chip is not subjected to the disturbance, the first-type level shifters 100 and 200 can be operated normally. However, in case that the ground voltage GND in the IC chip is subjected to the disturbance, the first-type level shifters 100 and 200 may be unable to be operated normally.

In order to overcome the above drawbacks, the low voltage devices with the lower threshold voltage are suitably used to design the level shifter. For example, the N-type transistors MN1 and MN2 are low voltage devices with the lower threshold voltage (e.g., 0.5V). In case that the N-type transistor MN1 and the ground voltage GND is subjected to the disturbance, the gate-source voltage $V_{GS}$ of the N-type transistor MN1 is still subjected to the change. However, the gate-source voltage $V_{GS}$ of the N-type transistor MN1 is higher than the threshold voltage (e.g., 0.5V) of the N-type transistor MN1. As a consequence, the problem of causing the malfunction of the first-type level shifter will be avoided. As known, the low voltage devices are unable to withstand the higher voltage stress. Consequently, the level shifter needs to be equipped with a bias circuit to avoid the damage of the low voltage devices because of the higher voltage stress.

Figure 3:
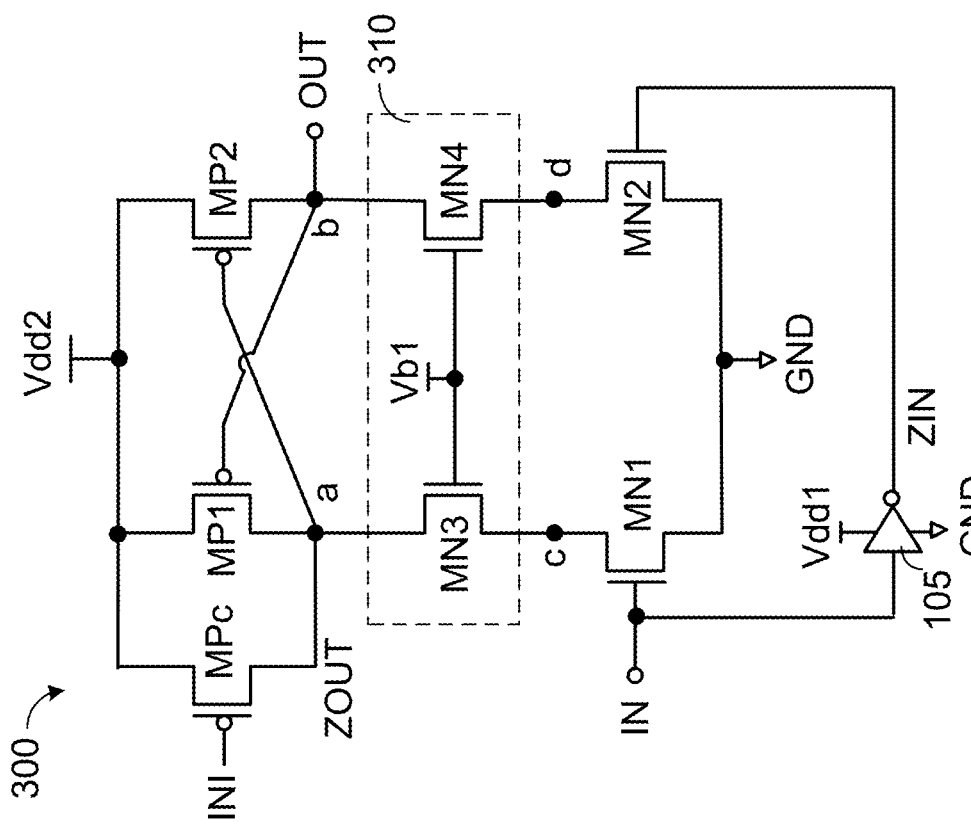
FIG. 3 is a schematic circuit diagram illustrating an example of a second-type level shifter.

FIG. 3 is a schematic circuit diagram illustrating an example of a second-type level shifter. By the second-type level shifter 300, an input signal IN and an inverted input signal ZIN in the range between a voltage Vdd1 and a voltage GND are converted into an output voltage OUT and an inverted output voltage ZOUT in the range between a voltage Vdd2 and the voltage GND. The voltage Vdd1 is a power supply voltage (e.g., 1V), the voltage Vdd2 is another power supply voltage (e.g., 5V), and the voltage GND is a ground voltage (e.g., 0V). The second-type level shifter 300 receives an initial signal INI. According to the initial signal INI, the initial state of the second-type level shifter 300 before enabled can be controlled. The initial signal INI is in the range between the voltage Vdd2 and the ground voltage GND.

As shown in FIG. 3, the second-type level shifter 300 comprises an inverter 105, a P-type transistor MP1, a P-type transistor MP2, a P-type transistor MPc, an N-type transistor MN1, an N-type transistor MN2 and a bias circuit 310. The P-type transistor MP1, the P-type transistor MP2 and the P-type transistor MPc are medium voltage devices. The N-type transistor MN1 and the N-type transistor MN2 are low voltage devices with lower threshold voltage and usually having lower input impedance in comparison with N-type transistor MN1 and the N-type transistor MN2 of the first-type level shifter 100 and 200. In addition, the second-type level shifter 300 at least comprises an initial terminal, an input terminal and an output terminal. The initial terminal of the second-type level shifter 300 receives the initial signal INI. The input terminal of the second-type level shifter 300 receives the input signal IN. The output terminal of the second-type level shifter 300 generates the output signal OUT.

The inverter 105 is connected with the power supply voltage Vdd1 and the ground voltage GND. The input terminal of the inverter 105 is connected with the input terminal of the second-type level shifter 300 to receive the input signal IN. The output terminal of the inverter 105 generates the inverted input signal ZIN.

The source terminal of the P-type transistor MP1 receives the power supply voltage Vdd2. The drain terminal of the P-type transistor MP1 is connected with a node "a". The gate terminal of the P-type transistor MP1 is connected with a node "b". The source terminal of the P-type transistor MP2 receives the power supply voltage Vdd2. The drain terminal of the P-type transistor MP2 is connected with the node "b". The gate terminal of the P-type transistor MP2 is connected with the node "a". The source terminal of the P-type transistor MPc receives the power supply voltage Vdd2. The drain terminal of the P-type transistor MPc is connected with the node "a". The gate terminal of the P-type transistor MPc receives the enable signal EN. The node "b" is connected with the output terminal of the second-type level shifter 300 to generate the output signal OUT. The node "a" is served as another output terminal to output the inverted output signal ZOUT.

The drain terminal of the N-type transistor MN1 is connected with a node "c". The source terminal of the N-type transistor MN1 receives the ground voltage GND. The gate terminal of the N-type transistor MN1 receives the input signal IN. The drain terminal of the N-type transistor MN2 is connected with a node "d". The source terminal of the N-type transistor MN2 receives ground voltage GND. The gate terminal of the N-type transistor MN2 receives the inverted input signal ZIN.

The bias circuit 310 is coupled between the node "a" and the node "c", and the bias circuit 310 is coupled between the node "b" and the node "d". The bias circuit 310 comprises an N-type transistor MN3 and an N-type transistor MN4. The drain terminal of the N-type transistor MN3 is connected with the node a. The source terminal of the N-type transistor MN3 is connected with the node "c". The gate terminal of the N-type transistor MN3 receives a bias voltage Vb1. The drain terminal of the N-type transistor MN4 is connected with the node "b". The source terminal of the N-type transistor MN4 is connected with the node "d". The gate terminal of the N-type transistor MN4 receives the bias voltage Vb1.

In this embodiment, the bias voltage Vb1 is in the range between the power supply voltage Vdd1 and the power supply voltage Vdd2. In case that the second-type level shifter 300 does not receive the bias voltage Vb1, the N-type transistor MN3 and the N-type transistor MN4 are turned off. Consequently, the second-type level shifter 300 is disabled. In case that the second-type level shifter 300 receives the bias voltage Vb1, the second-type level shifter 300 is enabled and operated normally. For example, the bias voltage Vb1 is 2.0V.

When the second-type level shifter 300 is operated normally, the N-type transistor MN3 and the N-type transistor MN4 are maintained in the conducting state through the bias voltage Vb1. In addition, the maximum voltages at the node "c" and the node "d" are limited to the voltage (Vb1−Vt3), wherein the voltage Vt3 is the threshold voltage of each of the N-type transistor MN3 and the N-type transistor MN4. For example, the voltage Vt3 is 0.9V. Consequently, when the second-type level shifter 300 is operated normally, the maximum voltage at each of the node c and the node d is controlled to be approximately 1.1V (e.g., 2.0V−0.9V). This maximum voltage (i.e., 1.1V) is the voltage stress that the N-type transistor MN1 and the N-type transistor MN2 can withstand. Consequently, the N-type transistor MN1 and the N-type transistor MN2 will not be damaged, and the malfunction problem of the second-type level shifter 300 can be avoided.

Please refer to FIG. 3 again. In case that the initial signal INI is in the logic low level state, the initial signal INI is activated, and the second-type level shifter 300 is disable. Consequently, the P-type transistor MPc is turned on. Meanwhile, regardless of the changes of the input signal IN and the inverted input signal ZIN, the second-type level shifter 300 is maintained in the initial state, the output signal OUT is maintained in the logic low level state, and the inverted output signal ZOUT is maintained in the logic high level state. That is to say, the output signal OUT and the inverted output signal ZOUT in the initial state of the second-type level shifter 300 before enabled can be controlled according to the initial signal INI.

In case that the initial signal INI is in the logic high level state, the initial signal INI is inactivated, and the second-type level shifter 300 is enabled. Consequently, the P-type transistor MPc is turned off. Meanwhile, the output signal OUT and the inverted output signal ZOUT of the second-type level shifter 300 are changed with the changes of the input signal IN and the inverted input signal ZIN. That is, after the second-type level shifter 300 receives the bias voltage Vb1 and is enabled (i.e., the initial signal INI is inactivated), the second-type level shifter 300 can be operated normally.

In case that the input signal IN is in a logic high level state corresponding to the power supply voltage Vdd1 and the inverted input signal ZIN is in a logic low level state (e.g., 0V), the N-type transistor MN1 and the P-type transistor MP2 are turned on, the N-type transistor MN2 and the P-type transistor MP1 are turned off, and the bias circuit 310 is in the conducting state. The node "a" is coupled to the node "c" through the bias circuit 310, and the node "b" is coupled to the node "d" through the bias circuit 310. Consequently, the output signal OUT is in the logic high level state corresponding to the power supply voltage Vdd2, and the inverted output signal ZOUT is in the logic low level state (e.g., 0V).

In case that the input signal IN is in the logic low level state (e.g., 0V) and the inverted input signal ZIN is in the logic high level state corresponding to the power supply voltage Vdd1, the N-type transistor MN1 and the P-type transistor MP2 are turned off, the N-type transistor MN2 and the P-type transistor MP1 are turned on, and the bias circuit 310 is in the conducting state. The node "a" is coupled to the node "c" through the bias circuit 310, and the node "b" is coupled to the node "d" through the bias circuit 310. Consequently, the output signal OUT is in the logic low level state (e.g., 0V), and the inverted output signal ZOUT is in the logic high level state corresponding to the power supply voltage Vdd2. That is, the output signal OUT is the shifted signal of the input signal IN.

It is noted that numerous modifications and alterations may be made while retaining the teachings of the invention. For example, when the second-type level shifter 300 is in the initial state, the output signal OUT is in the logic high level state, and the inverted output signal ZOUT is in the logic low level state. For example, the connecting relationship between the P-type transistor MP3 and associated components in FIG. 3 is modified. The source terminal of the P-type transistor MPc receives the power supply voltage Vdd2. The drain terminal of the P-type transistor MPc is connected with the node "b". The gate terminal of the P-type transistor MPc receives the initial signal INI. Consequently, in case that the initial signal INI is activated, the output signal OUT of the second-type level shifter 300 is maintained in the logic high level state, and the inverted output signal ZOUT is maintained in the logic low level state.

Figure 4:
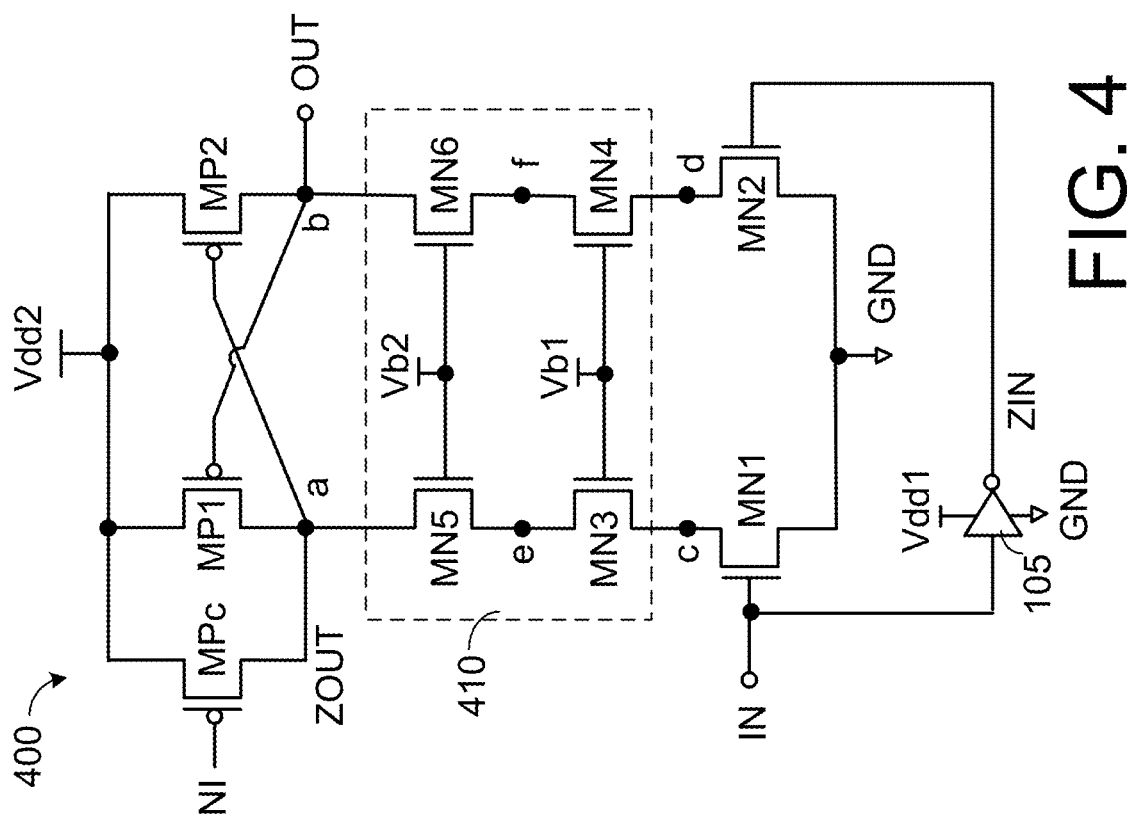
FIG. 4 is a schematic circuit diagram illustrating another example of the second-type level shifter.

FIG. 4 is a schematic circuit diagram illustrating another example of the second-type level shifter. In comparison with the second-type level shifter 300 of FIG. 3, the circuitry structure of the bias circuit 410 in the second-type level shifter 400 of FIG. 4 is distinguished. The operating principles of the second-type level shifter 400 are similar to the operating principles of the second-type level shifter 300. For brevity, only the circuitry structure of the bias circuit 410 will be described as follows.

The bias circuit 410 is coupled between the node "a" and the node "c", and the bias circuit 410 is coupled between the node "b" and the node "d". The bias circuit 410 comprises an N-type transistor MN3, an N-type transistor MN4, an N-type transistor MN5 and an N-type transistor MN6. The drain terminal of the N-type transistor MN3 is connected with a node "e". The source terminal of the N-type transistor MN3 is connected with the node "c". The gate terminal of the N-type transistor MN3 receives a bias voltage Vb1. The drain terminal of the N-type transistor MN4 is connected with a node "f". The source terminal of the N-type transistor MN4 is connected with the node "d". The gate terminal of the N-type transistor MN4 receives the bias voltage Vb1. The drain terminal of the N-type transistor MN5 is connected with the node "a". The source terminal of the N-type transistor MN5 is connected with the node "e". The gate terminal of the N-type transistor MN5 receives a bias voltage Vb2. The drain terminal of the N-type transistor MN6 is connected with the node "b". The source terminal of the N-type transistor MN6 is connected with the node "f". The gate terminal of the N-type transistor MN6 receives the bias voltage Vb2.

Each of the bias voltage Vb1 and the bias voltage Vb2 is in the range between the power supply voltage Vdd1 and the power supply voltage Vdd2. In addition, the bias voltage Vb2 is higher than the bias voltage Vb1. For example, the bias voltage Vb2 is 3.0V, and the bias voltage Vb1 is 2.0V. Similarly, when the second-type level shifter 400 is operated normally, the N-type transistor MN3 and the N-type transistor MN4 are maintained in the conducting state through the bias voltage Vb1, and the N-type transistor MN5 and the N-type transistor MN6 are maintained in the conducting state through the bias voltage Vb2. Moreover, the maximum voltage at each of the node "c" and the node "d" is controlled in the range between the bias voltage Vb1 and a voltage Vt3 through the bias circuit 410, wherein the voltage Vt3 is the threshold voltage of each of the N-type transistor MN3 and the N-type transistor MN4. Consequently, the N-type transistor MN1 and the N-type transistor MN2 will not be damaged, and the malfunction problem of the second-type level shifter 400 can be avoided.

As shown in FIG. 3 and FIG. 4, the second-type level shifter 300 is equipped with the bias circuit 310, and the second-type level shifter 400 is equipped with the bias circuit 410. For allowing the second-type level shifter 300 and the second-type level shifter 400 to be operated normally, the IC chip further comprises a bias voltage generator to continuously provide the bias voltage Vb1 and the bias voltage Vb2 to the bias circuits 310 and 410. Due to the arrangement of the bias voltage generator, the IC chip additionally consumes electric power. For example, the bias voltage generator is a low dropout regulator (LDO) or a voltage divider. The bias voltage generator is connected with the power supply voltage Vdd2. When the bias voltage generator is enabled, each of the bias voltage Vb1 and the bias voltage Vb2 outputted from the bias voltage generator is lower than the power supply voltage Vdd2.

Figure 5A:
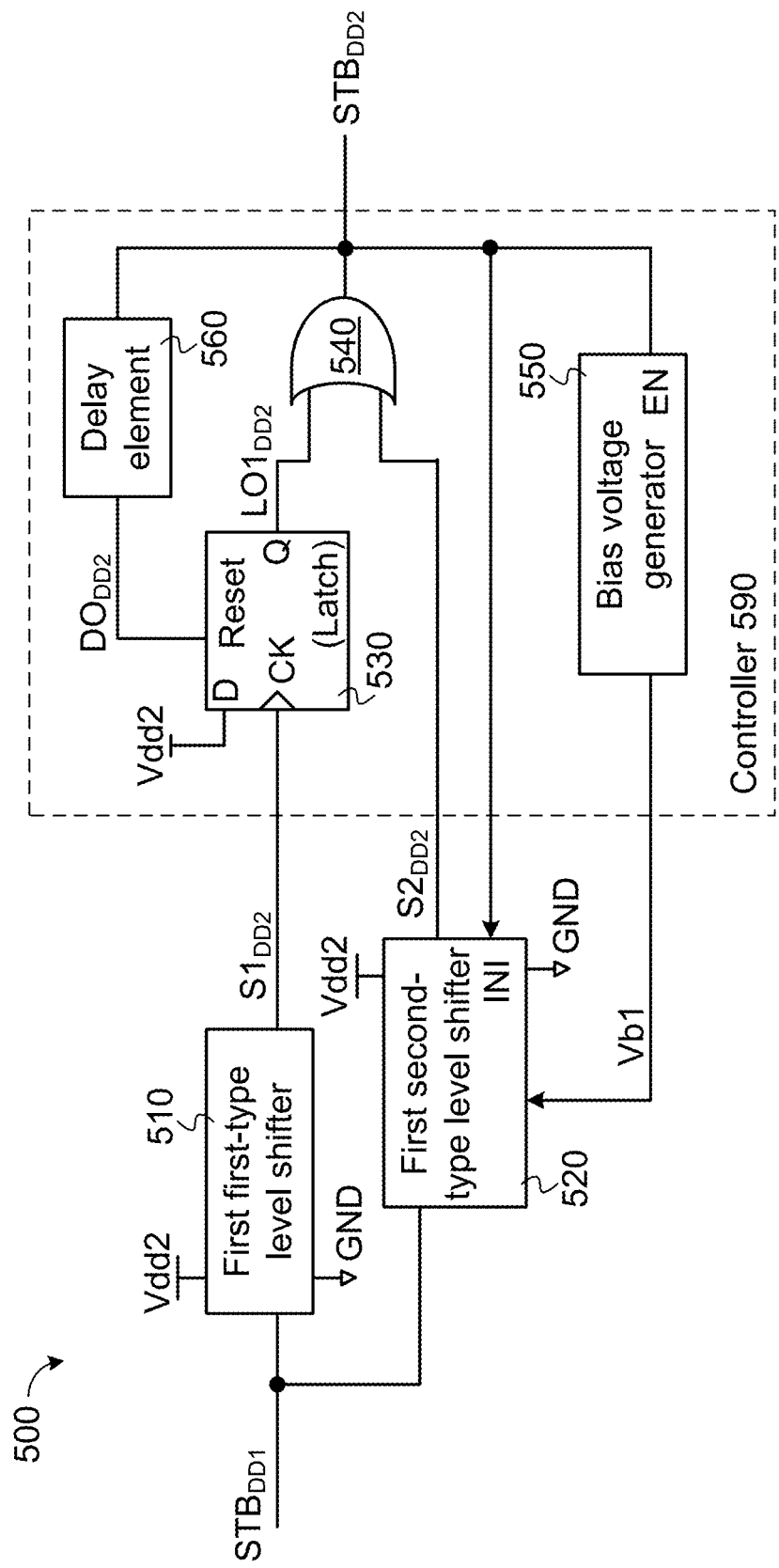
FIG. 5A is a schematic circuit block diagram illustrating a level shifting circuit according to a first embodiment of the present invention.
Figure 5B:
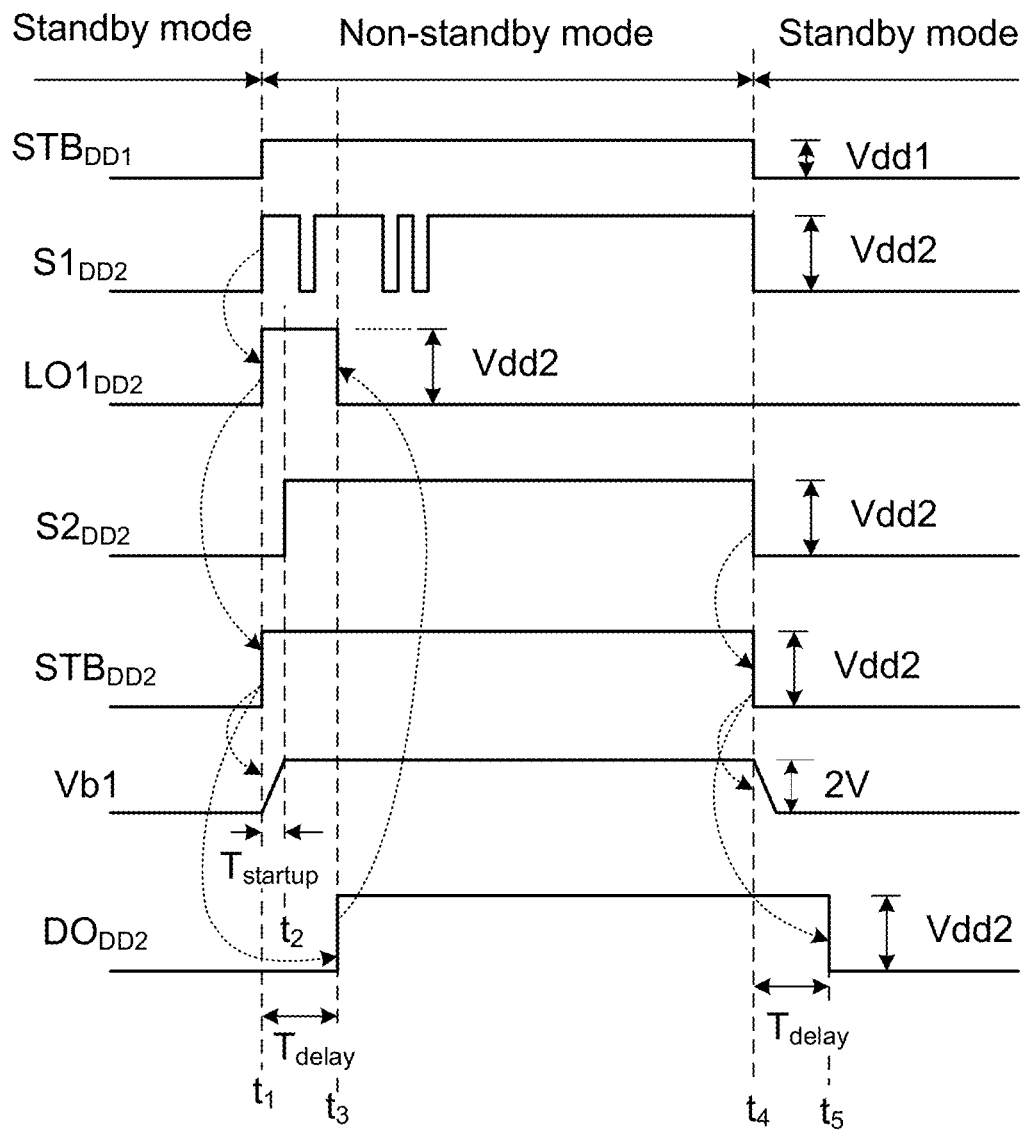
FIG. 5B is a schematic timing waveform diagram illustrating associated signals of the level shifting circuit shown in FIG. 5A.

FIG. 5A is a schematic circuit block diagram illustrating a level shifting circuit according to a first embodiment of the present invention. FIG. 5B is a schematic timing waveform diagram illustrating associated signals of the level shifting circuit shown in FIG. 5A.

Generally, when the IC chip is in a standby mode, most of the circuits in the IC chip are disabled. Since the total current generated inside the IC chip is very small, the ground voltage GND will not be subjected to the disturbance. Whereas, when the IC chip is in a non-standby mode, most of the circuits in the IC chip are enabled. Since the total current generated inside the IC chip is larger, the ground voltage GND is possibly subjected to the disturbance. In accordance with a feature of the present invention, the level shifting circuit 500 is designed according to the characteristics of different types of level shifters. Consequently, the level shifting circuit 500 can be operated in different modes.

The level shifting circuit 500 is included in an IC chip. According to a mode signal, the level shifting circuit 500 can be selectively operated in one of two modes. The level shifting circuit 500 receives the mode signal and outputs a shifted mode signal. For example, the mode signal is the standby signal. When the standby signal is in a first logic level state (e.g., a logic low level state), the IC chip is in the standby mode. When the standby signal is in a second logic level state (e.g., a logic high level state), the IC chip is in a non-standby mode, which is also known as a chip enable mode.

The level shifting circuit 500 comprises a first first-type level shifter 510, a first second-type level shifter 520 and a controller 590. In addition, the level shifting circuit 500 has an input terminal and an output terminal. The input terminal of the level shifting circuit 500 receives a standby signal $STB_{DD1}$. The output terminal of the level shifting circuit 500 outputs a shifted standby signal $STB_{DD2}$. By the level shifting circuit 500, the standby signal $STB_{DD1}$ in a first power domain is converted into the shifted standby signal $STB_{DD2}$ in a second power domain. In FIGS. 5A and 5B, the signals with the subscript DD1 represent the signals in the first power domain, and the signals with the subscript DD2 represent the signals in the second power domain.

In the level shifting circuit 500, the first first-type level shifter 510 is implemented with the level shifter 100 of FIG. 1 or the level shifter 200 of FIG. 2A, and the first second-type level shifter 520 is implemented with the level shifter 300 of FIG. 3 or the level shifter 400 of FIG. 4. Moreover, the first second-type level shifter 520 further comprises a bias circuit and an initial terminal.

In the first embodiment, the input terminals of the first-type level shifter 510 and the first second-type level shifter 520 receive the standby signal $STB_{DD1}$. The output terminal of the first first-type level shifter 510 outputs a first shifted signal $S1_{DD2}$. The output terminal of the first second-type level shifter 520 outputs a second shifted signal $S2_{DD2}$. The controller 590 is coupled to the output terminal of the first first-type level shifter 510 and the output terminal of the first second-type level shifter 520.

In the standby mode, the standby signal $STB_{DD1}$ is in the first logic level state (e.g., the logic low level state), and the first second-type level shifter 520 is disabled by the controller 590. In addition, the controller 590 does not provide the bias voltage Vb1 to the first second-type level shifter 520. According to the first shifted signal $S1_{DD2}$ in the first logic level state, the controller 590 generates the shifted standby signal $STB_{DD2}$ in the first logic level state.

In the non-standby mode, the standby signal $STB_{DD1}$ is in the second logic level state (e.g., the logic high level state), and the first shifted signal $S1_{DD2}$ from the first first-type level shifter 510 is ignored by the controller 590. Moreover, the controller 590 enables the first second-type level shifter 520 and provides the bias voltage Vb1 to the first second-type level shifter 520. According to the second shifted signal $S2_{DD2}$ in the second logic level state, the controller 590 generates the shifted standby signal $ST_{BDD2}$ in the second logic level state.

Please refer to FIG. 5A again. The controller 590 comprises a latch 530, an OR gate 540, a bias voltage generator 550 and a delay element 560. The controller 590 belongs to the second power domain. That is, the latch 530, the OR gate 540, the bias voltage generator 550 and the delay element 560 belong to the circuits in the second power domain. The connecting relationship between associated components of the level shifting circuit 500 and the operating principles of the level shifting circuit 500 will be described in more details.

The input terminal of the first first-type level shifter 510 is coupled to the input terminal of the level shifting circuit 500 to receive the standby signal $STB_{DD1}$. The input terminal of the first second-type level shifter 520 is coupled to the input terminal of the level shifting circuit 500 to receive the standby signal $STB_{DD1}$. The input terminal of the latch 530 is coupled to the output terminal of the first first-type level shifter 510. The reset terminal of the latch 530 is coupled to the output terminal of the delay element 560. The first input terminal of the OR gate 540 is coupled to the output terminal of the latch 530. The second input terminal of the OR gate 540 is coupled to the output terminal of the first second-type level shifter 520. The output terminal of the OR gate 540 is coupled to the initial terminal INI of the first second-type level shifter 520. In addition, the output terminal of the OR gate 540 is served as the output terminal of the level shifting circuit 500 to generate the shifted standby signal $STB_{DD2}$. Moreover, the input terminal of the delay element 560 is coupled to the output terminal of the OR gate 540. The output terminal of the delay element 560 is connected with the reset terminal Reset of the latch 530. The enable terminal EN of the bias voltage generator 550 is coupled to the output terminal of the OR gate 540. The bias voltage generator 550 can generate at least one bias voltage Vb1 to the first second-type level shifter 520.

In case that the circuitry structure of the first second-type level shifter 520 is similar to the circuitry structure of the second-type level shifter 400 of FIG. 4, the bias voltage generator 550 can provide two bias voltages Vb1 and Vb2 to the first second-type level shifter 520.

In the first embodiment, the latch 530 is implemented with a D flip-flop. The clock input terminal CK of the D flip-flop is served as the input terminal of the latch 530. The output terminal Q of the D flip-flop is served as the output terminal of the latch 530. Moreover, the data terminal D of the D flip-flop receives the logic high level (Vdd2). The reset terminal Reset of the D flip-flop is coupled to the output terminal of the delay element 560.

It is noted that the latch 530 may be implemented with any other appropriate circuit. For example, in another embodiment, the latch 530 is implemented with a RS flip-flop. The clock signal terminal CK of the RS flip-flop is served as the input terminal of the latch 530. The output terminal Q of the RS flip-flop is served as the output terminal of the latch 530. Moreover, the S terminal of the RS flip-flop receives the logic high level (Vdd2). The R terminal of the RS flip-flop receives the logic low level (GND). The reset terminal Reset of the RS flip-flop is coupled to the output terminal of the delay element 560. Alternatively, the latch 530 is implemented with a JK flip-flop. The clock input terminal CK of the JK flip-flop is served as the input terminal of the latch 530. The output terminal Q of the JK flip-flop is served as the output terminal of the latch 530. The J terminal of the JK flip-flop receives the logic high level (Vdd2). The K terminal of the JK flip-flop receives the logic low level (GND). The reset terminal Reset of the JK flip-flop is coupled to the output terminal of the delay element 560.

For example, in case that the standby signal $STB_{DD1}$ and the shifted standby signal $STB_{DD2}$ are in the logic low level state, the IC chip is in the standby mode. Whereas, in case that the standby signal $STB_{DD1}$ and the shifted standby signal $STB_{DD2}$ are in the logic high level state, the IC chip is in the non-standby mode.

Please refer to FIG. 5B. Before the time point $t_1$, the IC chip is in the standby mode. The standby signal $STB_{DD1}$ received by the input terminal of the level shifting circuit 500 is in the logic low level state. The first shifted signal $S1_{DD2}$ outputted from the first first-type level shifter 510 is in the logic low level state. In addition, the first second-type level shifter 520 is disabled and maintained in the initial state. The second shifted signal $S2_{DD2}$ outputted from the first second-type level shifter 520 is in the logic low level state. Consequently, the shifted standby signal $STB_{DD2}$ from the output terminal of the level shifting circuit 500 (or the output terminal of the OR gate 540) is in the logic low level state.

Since the shifted standby signal $STB_{DD2}$ is in the logic low level state, the bias voltage generator 550 is disabled. That is, the bias voltage generator 550 is unable to provide the bias voltage Vb1. Moreover, since the first second-type level shifter 520 is disabled and maintained in the initial state, the second shifted signal $S2_{DD2}$ outputted from the first second-type level shifter 520 is in the logic low level state. In addition, the delay output signal $DO_{DD2}$ outputted from the delay element 560 is in the logic low level state. Since the latch 530 is not reset, the latch 530 is operated normally. The latch output signal $LO1_{DD2}$ outputted from the output terminal Q of the latch 530 is in the logic low level state.

At the time point $t_1$, the standby mode is switched to the non-standby mode. The standby signal $STB_{DD1}$ is switched from the logic low level state to the logic high level state. The first shifted signal $S1_{DD2}$ outputted from the first first-type level shifter 510 is switched from the logic low level state to the logic high level state. Consequently, the latch 530 is activated. The latch output signal $LO1_{DD2}$ outputted from the output terminal Q of the latch 530 is switched from the logic low level state to the logic high level state, and the latch output signal $LO1_{DD2}$ is latched at the logic high level state. In addition, the first second-type level shifter 520 is disabled and maintained in the initial state. The second shifted signal $S2_{DD2}$ outputted from the first second-type level shifter 520 is in the logic low level state. In addition, the shifted standby signal $STB_{DD2}$ from the output terminal of the level shifting circuit 500 (or the output terminal of the OR gate 540) is switched from the logic low level state to the logic high level state. Consequently, the first second-type level shifter 520 and the bias voltage generator 550 are enabled.

Since the bias voltage generator 550 is enabled, the bias voltage generator 550 starts to provide the bias voltage Vb1. The delay output signal $DO_{DD2}$ outputted from the delay element 560 is in the logic low level state. Since the latch 530 is not reset, the latch 530 is operated normally. The latch output signal $LO1_{DD2}$ outputted from the output terminal Q of the latch 530 is in the logic high level state.

Please refer to FIG. 5B again. After the bias voltage generator 550 has been enabled for a start-up time $T_{startup}$, the bias voltage generator 550 can provide the stable bias voltage Vb1 (e.g., 2V), and thus the first second-type level shifter 520 is enabled. In accordance with another feature of the present invention, the delay time $T_{delay}$ of the delay element 560 is longer than or equal to the start-up time $T_{startup}$. In this way, the shifted standby signal $STB_{DD2}$ from the output terminal of the level shifting circuit 500 will not generate the glitch. As a consequence, the malfunction problem can be avoided.

That is to say, at the time point $t_2$ after the start-up time $T_{startup}$ of the time point $t_1$, the bias voltage generator 550 provides a stable bias voltage Vb1 to the first second-type level shifter 520. Consequently, the first second-type level shifter 520 starts to operate, and the second shifted signal $S2_{DD2}$ outputted from the first second-type level shifter 520 is switched from the logic low level to the logic high level.

At the time point $t_3$ after the delay time $T_{delay}$ of the time point $t_1$, the delay output signal $DO_{DD2}$ outputted from the delay element 560 is switched from the logic low level state to the logic high level state. Consequently, the latch 530 is reset. The latch output signal $LO1_{DD2}$ outputted from the output terminal Q of the latch 530 is in the logic low level state. Since the second shifted signal $S2_{DD2}$ outputted from the first second-type level shifter 520 is in the logic high level state, the shifted standby signal $STB_{DD2}$ from the output terminal of the level shifting circuit 500 (or the output terminal of the OR gate 540) is maintained in the logic high level state.

At the time point $t_4$, the IC chip is switched from the non-standby mode to the standby mode. The standby signal $STB_{DD1}$ is switched from the logic high level state to the logic low level state. The first shifted signal $S1_{DD2}$ outputted from the first first-type level shifter 510 is switched from the logic high level state to the logic low level state. $DO_{DD2}$ is still the logic high level state. The latch 530 is reset and the latch output signal $LO1_{DD2}$ outputted the logic low level state. The second shifted signal $S2_{DD2}$ outputted from the first second-type level shifter 520 is switched from the logic high level state to the logic low level state. The shifted standby signal $STB_{DD2}$ from the output terminal of the level shifting circuit 500 (or the output terminal of the OR gate 540) is switched from the logic high level state to the logic low level state. Since the shifted standby signal $STB_{DD2}$ is in the logic low level state, the first second-type level shifter 520 is disabled and restored to the initial state. Moreover, since the bias voltage generator 550 is disabled, the bias voltage generator 550 stops providing the stable bias voltage Vb1.

After the bias voltage generator 550 has been disabled for the delay time $T_{delay}$, i.e., at the time point $t_5$, the delay output signal $DO_{DD2}$ outputted from the delay element 560 is switched from the logic high level state to the logic low level state. Consequently, the latch 530 is not reset. The latch 530 is operated normally to wait for the next time of switching the logic level of the first shifted signal $S1_{DD2}$. In some embodiments, the delay element 560 can be modified according to actual design requirements, when the IC chip is switched from the non-standby mode to the standby mode, the delay output signal $DO_{DD2}$ is switched to the logic low level state without the delay time $T_{delay}$ from the time point $t_4$ to the time point $t_5$.

When the IC chip is in the non-standby mode, the ground voltage GND is possibly subjected to disturbance. Consequently, the first shifted signal $S1_{DD2}$ outputted from the first first-type level shifter 510 generates the glitch. Please refer to FIG. 5B again. In the time interval between the time point $t_1$ and the time point $t_3$, the first shifted signal $S1_{DD2}$ generates the glitch. Since the latch output signal $LO1_{DD2}$ outputted from the latch 530 is latched in the logic high level state, the shifted standby signal $STB_{DD2}$ will not generate the glitch. In the time interval between the time point $t_3$ and the time point $t_4$, the first shifted signal $S1_{DD2}$ generates the glitch. Since the latch 530 has been reset, the latch output signal $LO1_{DD2}$ outputted from the latch 530 is in the logic low level state. Consequently, the shifted standby signal $STB_{DD2}$ will not generate the glitch. That is, since the first shifted signal $S1_{DD2}$ outputted from the first first-type level shifter 510 is ignored by the latch 530 of the controller 530 when the IC chip is in the non-standby mode, the shifted standby signal $STB_{DD2}$ will not generate the glitch.

In the standby mode, the first second-type level shifter 520 is disabled. Moreover, since the bias voltage generator 550 is disabled, the bias voltage generator 550 stops providing the stable bias voltage Vb1. Consequently, in the standby mode, the power consumption of the IC chip can be reduced.

The above concepts can be expanded. For example, according to plural mode signals, the level shifting circuit in the IC chip can be operated in more modes. For example, the level shifting circuit can be operated in three modes according to tow mode signals. The level shifting circuit receives two mode signals and outputs two shifted mode signals.

In the following embodiment, the two mode signals include a deep standby signal and a standby signal. According to the deep standby signal and the standby signal, plural modes can be determined. When both of the deep standby signal and the standby signal are in a first logic level state (e.g., a logic low level state), the IC chip is in the deep standby mode. When the deep standby signal is in a second logic level state (e.g., a logic high level state), the IC chip is in the standby mode. When both of the deep standby signal and the standby signal are in the second logic level state (e.g., a logic high level state), the IC chip is in a non-standby mode, which is also known as a chip enable mode.

Figure 6A:
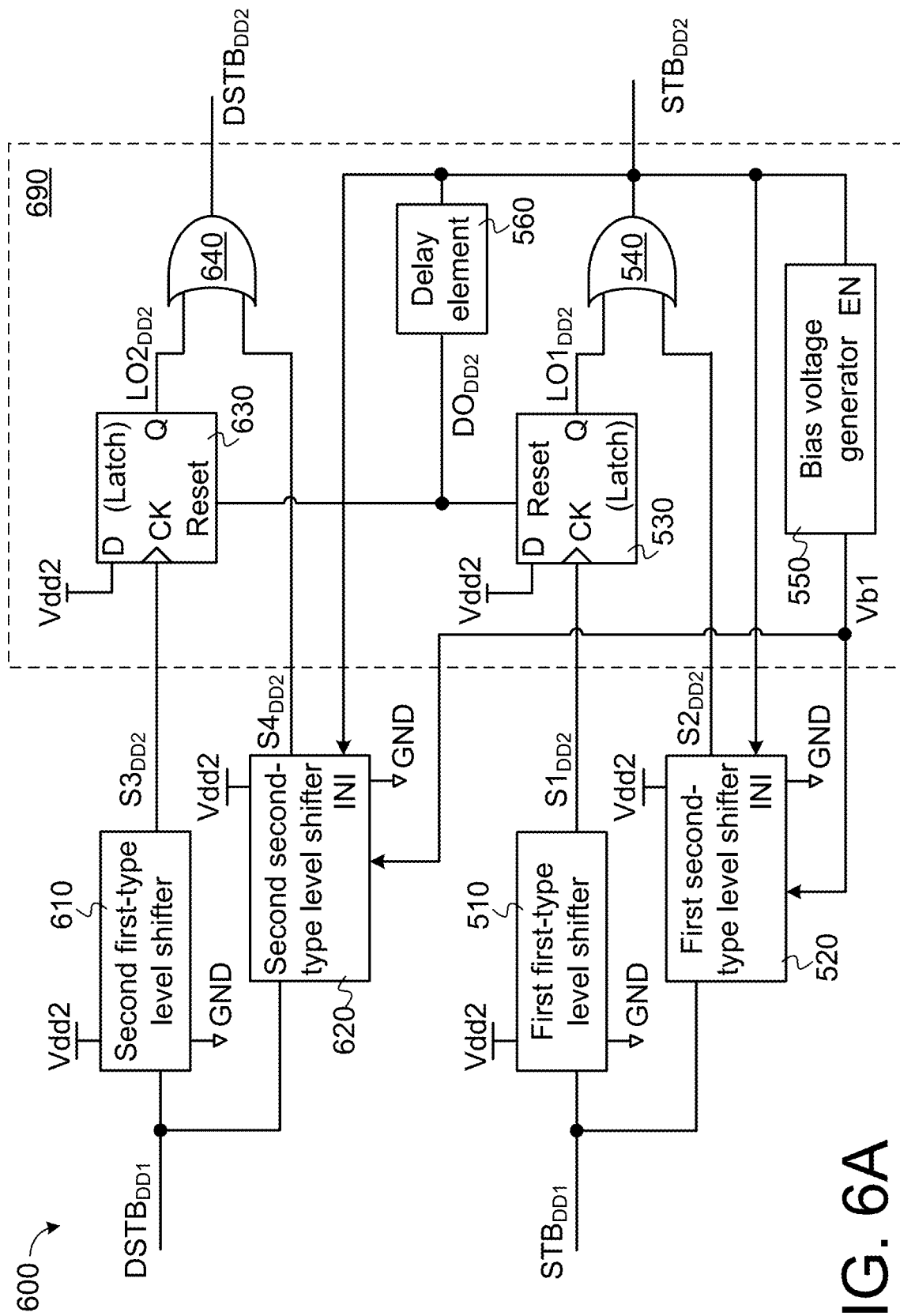
FIG. 6A is a schematic circuit block diagram illustrating a level shifting circuit according to a second embodiment of the present invention.
Figure 6B:
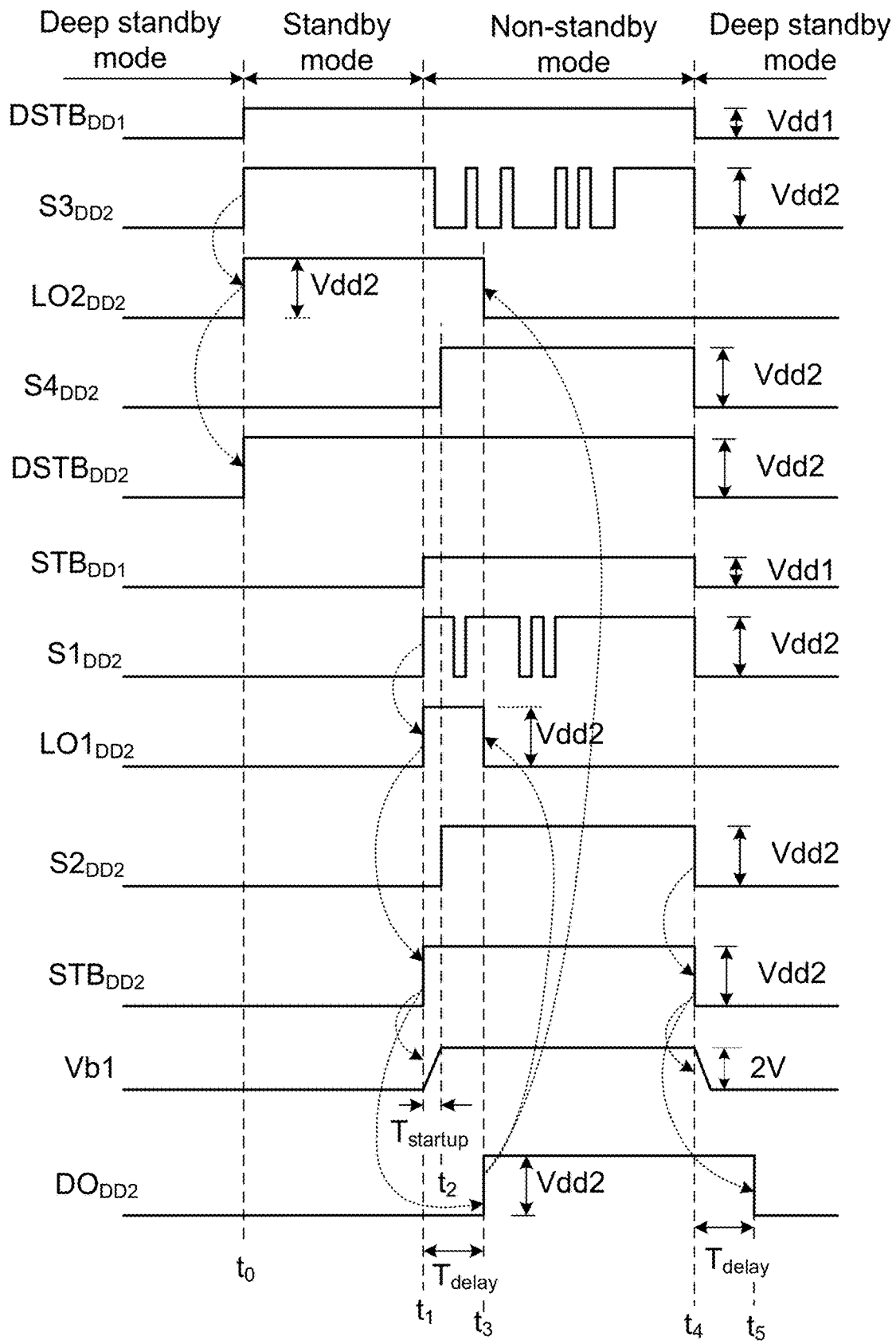
FIG. 6B is a schematic timing waveform diagram illustrating associated signals of the level shifting circuit shown in FIG. 6A.

FIG. 6A is a schematic circuit block diagram illustrating a level shifting circuit according to a second embodiment of the present invention. FIG. 6B is a schematic timing waveform diagram illustrating associated signals of the level shifting circuit shown in FIG. 6A. The level shifting circuit 600 comprises a first first-type level shifter 510, a second first-type level shifter 610, a first second-type level shifter 520, a second second-type level shifter 620 and a controller 690.

The level shifting circuit 600 comprises two input terminals and the two output terminals. The first terminal of the level shifting circuit 600 receives a standby signal $STB_{DD1}$. The first output terminal of the level shifting circuit 600 generates a shifted standby signal $STB_{DD2}$. The second input terminal of the level shifting circuit 600 receives a deep standby signal $DSTB_{DD1}$. The second output terminal of the level shifting circuit 600 generates a shifted deep standby signal $DSTB_{DD2}$. The standby signal $STB_{DD1}$ in the first power domain is converted into the shifted standby signal $STB_{DD2}$ in the second power domain by the level shifting circuit 600. In addition, the deep standby signal $DSTB_{DD1}$ in the first power domain is converted into the shifted deep standby signal $DSTB_{DD2}$ in the second power domain by the level shifting circuit 600.

Similarly, each of the first-type level shifters 510 and 610 is implemented with the first-type level shifter 100 of FIG. 1 or the first-type level shifter 200 of FIG. 2A. Similarly, each of the second-type level shifters 520 and 620 is implemented with the second-type level shifter 300 of FIG. 3 or the second-type level shifter 400 of FIG. 4. In addition, each of the second-type level shifters 520 and 620 further comprises a bias circuit and an initial terminal INI.

In the second embodiment, the output terminals of the first first-type level shifter 510 and the first second-type level shifter 520 receive the standby signal $STB_{DD1}$. The output terminal of the first first-type level shifter 510 and the output terminal of the first second-type level shifter 520 generate a first shifted signal $S1_{DD2}$ and a second shifted signal $S2_{DD2}$, respectively. The input terminals of the second first-type level shifter 610 and the second second-type level shifter 620 receive the deep standby signal $DSTB_{DD1}$. The output terminals of the second first-type level shifter 610 and the second second-type level shifter 620 generate a third shifted signal $S3_{DD2}$ and a fourth shifted signal $S4_{DD2}$, respectively. The controller 690 is coupled to the output terminals of the two first-type level shifters 510 and 610 and the output terminals of the two second-type level shifters 520 and 620.

In the deep standby mode, both of the standby signal $STB_{DD1}$ and the deep standby signal $DSTB_{DD1}$ are in a first logic level state (e.g., a logic low level state). The two second-type level shifters 520 and 620 are disabled by the controller 690. In addition, the controller 690 does not provide the bias voltage Vb1 to the two second-type level shifters 520 and 620. Moreover, according to the first shifted signal $S1_{DD2}$ and the third shifted signal $S3_{DD2}$ in the first logic level state, the controller 690 generates the shifted standby signal $STB_{DD2}$ and the shifted deep standbys signal $DSTB_{DD2}$ in the first logic level state.

In the standby mode, the deep standby signal $DSTB_{DD1}$ is in a second logic level state (e.g., a logic high level state), and the standby signal $STB_{DD1}$ is in the first logic level state. The two second-type level shifters 520 and 620 are disabled by the controller 690. In addition, the controller 690 does not provide the bias voltage Vb1 to the two second-type level shifters 520 and 620. Moreover, according to the third shifted signal $S3_{DD2}$ in the second logic level state, the controller 690 generates the shifted deep standby signal $DSTB_{DD2}$ in the second logic level state. According to the first shifted signal $S1_{DD2}$ in the first logic level state, the controller 690 generates the shifted standby signal $STB_{DD2}$ in the first logic level state.

In the non-standby mode, both of the standby signal $STB_{DD1}$ and the deep standby signal $DSTB_{DD1}$ are in the second logic level state. The first shifted signal $S1_{DD2}$ and the third shifted signal $S3_{DD2}$ from the two first-type level shifters 510 and 610 are ignored by the controller 690. Moreover, the controller 690 enables the two second-type level shifters 520 and 620 and provides the bias voltage Vb1 to the two second-type level shifters 520 and 620. Moreover, according to the fourth shifted signal $S4_{DD2}$ in the second logic level state, the controller 690 generates the shifted deep standby signal $DSTB_{DD2}$ in the second logic level state. According to the second shifted signal $S2_{DD2}$ in the second logic level state, the controller 690 generates the shifted standby signal $STB_{DD2}$ in the second logic level state.

In comparison with the controller 590 of FIG. 5A, the controller 690 of FIG. 6A further comprises a latch 630 and an OR gate 640. The controller 690 belongs to the circuit of the second power domain. For brevity, only the connecting relationships between the latch 630, the OR gate 640 and associated components and the operating principles of the latch 630 and the OR gate 640 will be described as follows.

The input terminal of the latch 630 is coupled to the output terminal of the second first-type level shifter 610. The reset terminal Reset of the latch 630 is coupled to the output terminal of the delay element 560. The first input terminal of the OR gate 640 is coupled to the output terminal of the latch 630. The second input terminal of the OR gate 640 is coupled to the output terminal of the second second-type level shifter 620. The output terminal of the OR gate 640 is connected with the second output terminal of the level shifting circuit 600 to generate the shifted deep standby signal $DSTB_{DD2}$. Moreover, the initial terminal INI of the second second-type level shifter 620 is coupled to the output terminal of the OR gate 540. In addition, the bias voltage generator 550 generates at least one bias voltage Vb1 to the second second-type level shifter 620.

Moreover, the latch 630 may be implemented with a D flip-flop, a RS flip-flop or a JK flip-flop.

Please refer to FIG. 6B. Before the time point $t_0$, the IC chip is in the deep standby mode. Both of the standby signal $STB_{DD1}$ and the deep standby signal $DSTB_{DD1}$ are in the logic low level state. The first shifted signal $S1_{DD2}$ outputted from the first first-type level shifter 510 is in the logic low level state. The third shifted signal $S3_{DD2}$ outputted from the second first-type level shifter 610 is in the logic low level state. In addition, the two second-type level shifters 520 and 620 are disabled and maintained in the initial state. The second shifted signal $S2_{DD2}$ and the fourth shifted signal $S4_{DD2}$ are in the logic low level state. Consequently, the shifted standby signal $STB_{DD2}$ from the first output terminal of the level shifting circuit 600 (or the output terminal of the OR gate 540) is in the logic low level state, and the shifted deep standbys signal $DSTB_{DD2}$ from the second output terminal of the level shifting circuit 600 (or the output terminal of the OR gate 640) is in the logic low level state.

Since the shifted standby signal $STB_{DD2}$ is in the logic low level state, the bias voltage generator 550 is disabled. That is, the bias voltage generator 550 is unable to provide the bias voltage Vb1. Moreover, since the second-type level shifters 520 and 620 are disabled and maintained in the initial state, the second shifted signal $S2_{DD2}$ outputted from the first second-type level shifter 520 and the fourth shifted signal $S4_{DD2}$ outputted from the second second-type level shifter 620 are in the logic low level state. In addition, the delay output signal $DO_{DD2}$ outputted from the delay element 560 is in the logic low level state. Since the two latches 530 and 630 are not reset, the two latches 530 and 630 are operated normally. The latch output signal $LO1_{DD2}$ outputted from the output terminal Q of the latch 530 and the latch output signal $LO2_{DD2}$ outputted from the output terminal Q of the latch 630 are in the logic low level state.

After the time point $t_1$, the waveforms of associated signals of the level shifting circuit 600 are similar to those of FIG. 5B. At the time point $t_1$, the second second-type level shifter 620 is enabled. At the time point $t_2$, the stable bias voltage Vb1 is provided to the second second-type level shifter 620. Consequently, the fourth shifted signal $S4_{DD2}$ is switched from the logic low level state to the logic high level state. At the time point $t_3$, the latch 630 is reset. At the time point $t_4$, both of the standby signal $STB_{DD1}$ and the deep standby signal $DSTB_{DD1}$ are switched to the logic low level state. In addition, the IC chip is restored to the deep standby mode.

When the IC chip is in the non-standby mode, the ground voltage GND is possibly subjected to disturbance. Consequently, the first shifted signal $S1_{DD2}$ outputted from the first first-type level shifter 510 and the third shifted signal $S3_{DD2}$ outputted from the second first-type level shifter 610 generate the glitch. Please refer to FIG. 6B again. In the non-standby mode, the first shifted signal $S1_{DD2}$ outputted from the first first-type level shifter 510 is ignored by the latch 530 of the controller 690, and the third shifted signal $S3_{DD2}$ outputted from the second first-type level shifter 610 is ignored by the latch 630 of the controller 690. Consequently, the standby signal $STB_{DD1}$ and the deep standby signal $DSTB_{DD1}$ outputted from the level shifting circuit 600 will not generate the glitch.

From the above descriptions, the present invention provides the level shifting circuit. The level shifting circuit can be operated in different modes. In the deep standby mode and the standby mode, the voltage level of the shifted signal outputted from the first-type level shifter is served as the voltage level of the output signal of the level shifting circuit. In the non-standby mode, the voltage level of the shifted signal outputted from the second-type level shifter is served as the voltage level of the output signal of the level shifting circuit.

It is noted that numerous modifications and alterations may be made while retaining the teachings of the invention. For example, the connecting relationships between the controllers 590, 690 and the associated components are not restricted. In addition, the first logic level and the second logic level are not restricted. For example, in another embodiment, the first logic level state us the logic high level state, and the second logic level state us the logic low level state. The above purposes can be easily achieved by modifying associated circuitry components in the controller.

Figure 7:
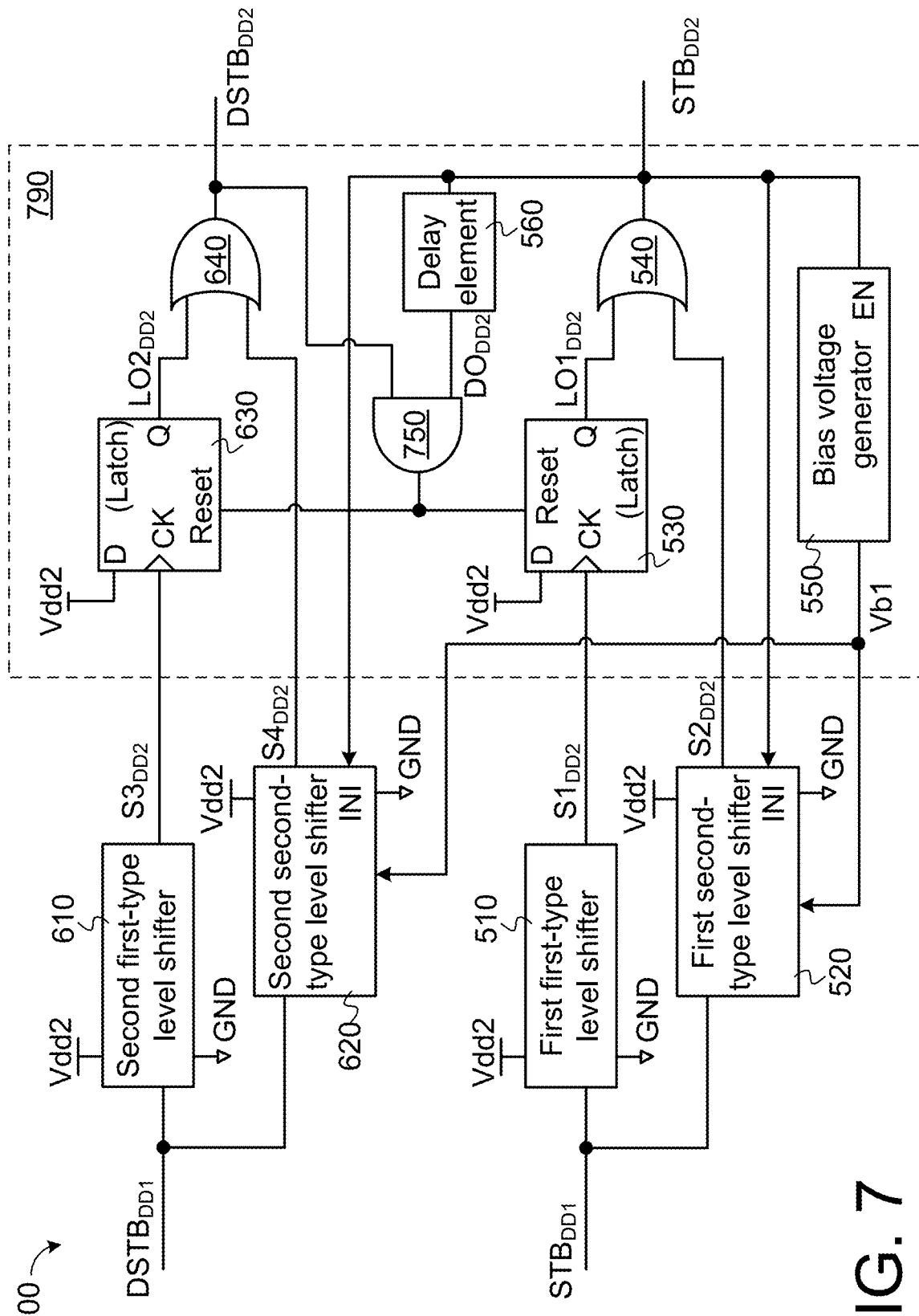
FIG. 7 is a schematic circuit block diagram illustrating a level shifting circuit according to a third embodiment of the present invention.

FIG. 7 is a schematic circuit block diagram illustrating a level shifting circuit according to a third embodiment of the present invention. In comparison with the level shifting circuit 600 of FIG. 6A, the controller 790 in the level shifting circuit 700 of this embodiment further comprises an AND gate 750. The output terminal of the delay element 560 is coupled to the reset terminal of the latch 530 and the reset terminal of the latch 630 through the AND gate 750. The first input terminal of the AND gate 750 is connected with the output terminal of the delay element 560. The second input terminal of the AND gate 750 is connected with the output terminal of the OR gate 640. The output terminal of the AND gate 750 is connected with the reset terminal of the latch 530 and the reset terminal of the latch 630. The waveforms of associated signals of the level shifting circuit 700 are similar to those of the level shifting circuit 600 of the second embodiment. After the time point $t_3$, the two latches 530 and 630 are reset.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifting circuit having a first input terminal and a first output terminal, the first input terminal of the level shifting circuit receiving a first mode signal in a first power domain, the first output terminal of the level shifting circuit generating a shifted first mode signal in a second power domain different from the first power domain, the level shifting circuit comprising:

a first first-type level shifter, wherein an input terminal of the first first-type level shifter is coupled to the first input terminal of the level shifting circuit, the input terminal of the first first-type level shifter receives the first mode signal, and an output terminal of the first first-type level shifter outputs a first shifted signal in the second power domain;

a first second-type level shifter, wherein an input terminal of the first second-type level shifter is coupled to the first input terminal of the level shifting circuit, the input terminal of the first second-type level shifter receives the first mode signal, and an output terminal of the first second-type level shifter outputs a second shifted signal in the second power domain, wherein the first second-type level shifter comprises a first bias circuit, and the first bias circuit receives at least one bias voltage for operating normally; and a controller coupled to the output terminal of the first first-type level shifter, and the output terminal of the first second-type level shifter, wherein in a standby mode, the first mode signal is in a first logic level state, the first second-type level shifter is disabled by the controller, and the controller does not provide the at least one bias voltage to the first bias circuit of the first second-type level shifter, wherein according to the first shifted signal in the first logic level state, the controller outputs the shifted first mode signal in the first logic level state, wherein in a non-standby mode, the first mode signal is in a second logic level state, the first shifted signal from the first first-type level shifter is ignored by the controller, and the controller provides the at least one bias voltage to the first bias circuit of the first second-type level shifter, wherein according to the second shifted signal in the second logic level state, the controller outputs the shifted first mode signal in the second logic level state.

2. The level shifting circuit as claimed in claim 1, wherein the controller comprises:

a delay element, wherein the delay element comprises an output terminal and an input terminal;

a first latch, wherein an input terminal of the first latch is coupled to the output terminal of the first first-type level shifter, and a reset terminal of the first latch is coupled to the output terminal of the delay element;

a first OR gate, wherein a first input terminal of the first OR gate is coupled to an output terminal of the first latch, a second input terminal of the first OR gate is coupled to the output terminal of the first second-type level shifter, an output terminal of the first OR gate is coupled to the input terminal of the delay element, and the output terminal of the first OR gate is served as the first output terminal of the level shifting circuit; and a bias voltage generator, wherein an enable terminal of the bias voltage generator is coupled to the output terminal of the first OR gate, when the bias voltage generator is enabled, the bias voltage generator provides the at least one bias voltage to the first bias circuit of the first second-type level shifter, wherein when the bias voltage generator is disabled, the bias voltage generator does not provide the at least one bias voltage to the first bias circuit of the first second-type level shifter.

3. The level shifting circuit as claimed in claim 2, wherein in the standby mode, the first latch outputs a first latch output signal in the first logic level state in the second power domain, the first OR gate outputs the shifted first mode signal in the first logic level state, and the delay element outputs a delay output signal in the first logic level state, so that the first latch is not reset, wherein according to the shifted first mode signal in the first logic level state, the first second-type level shifter and the bias voltage generator are disabled.

4. The level shifting circuit as claimed in claim 3, wherein when the level shifting circuit is switched from the standby mode to the non-standby mode, the first mode signal is switched from the first logic level state to the second logic level state, the first shifted signal is switched from the first logic level state to the second logic level state, the first latch output signal is switched from the first logic level state to the second logic level state, and the shifted first mode signal is switched form the first logic level state to the second logic level state.

5. The level shifting circuit as claimed in claim 4, wherein according to the shifted first mode signal in the second logic level state, the first second-type level shifter and the bias voltage generator are enabled, and the bias voltage generator provides the at least one bias voltage to the first bias circuit of the first second-type level shifter after the bias voltage generator has been enabled for a start-up time, wherein according to the shifted first mode signal in the second logic level state, the delay element generates the delay output signal in the second logic level state to the first latch after a delay time of the delay element, so that the first latch is reset, wherein the delay time is longer than or equal to the start-up time.

6. The level shifting circuit as claimed in claim 5, wherein after the standby mode has been switched to the non-standby mode for the delay time, the first second-type level shifter generates the second shifted signal in the second logic level state, and the first OR gate generates the shifted first mode signal in the second logic level state.

7. The level shifting circuit as claimed in claim 2, wherein the first latch is a D flip-flop, wherein a reset terminal of the D flip-flop is the reset terminal of the first latch, a clock input terminal of the D flip-flop is the input terminal of the first latch, an output terminal of the D flip-flop is the output terminal of the first latch, and a data terminal of the D flip-flop receives a logic high level in the second power domain.

8. The level shifting circuit as claimed in claim 1, wherein a voltage level of the first mode signal in the first logic level state is a ground voltage, and a voltage level of the first mode signal in the second logic level state is a first power supply voltage, wherein a voltage level of the shifted first mode signal in the first logic level is the ground voltage, and a voltage level of the shifted first mode signal in the second logic level state is a second power supply voltage.

9. The level shifting circuit as claimed in claim 8, wherein the first first-type level shifter comprises:

a first P-type transistor, wherein a source terminal of the first P-type transistor receives the second power supply voltage, a drain terminal of the P-type transistor is connected with a first node, and a gate terminal of the first P-type transistor is connected with a second node;

a second P-type transistor, wherein a source terminal of the second P-type transistor receives the second power supply voltage, a drain terminal of the second P-type transistor is connected with a third node, and a gate terminal of the second P-type transistor is connected with a fourth node;

an inverter, wherein an input terminal of the inverter is coupled to the input terminal of the first first-type level shifter;

a third P-type transistor, wherein a source terminal of the third P-type transistor is connected with the first node, a drain terminal of the third P-type transistor is connected with the fourth node, and a gate terminal of the third P-type transistor is connected with the input terminal of the inverter;

a fourth P-type transistor, wherein a source terminal of the fourth P-type transistor is connected with the third node, a drain terminal of the fourth P-type transistor is connected with the second node, and a gate terminal of the fourth P-type transistor is connected with an output terminal of the inverter;
a first N-type transistor, wherein a drain terminal of the first N-type transistor is connected with the fourth node, a source terminal of the first N-type transistor receives the ground voltage, and a gate terminal of the first N-type transistor is connected with the input terminal of the inverter; and
a second N-type transistor, wherein a drain terminal of the second N-type transistor is connected with the second node, a source terminal of the second N-type transistor receives the ground voltage, and a gate terminal of the second N-type transistor is connected with the output terminal of the inverter,
the second node is connected with the output terminal of the first first-type level shifter.

10. The level shifting circuit as claimed in claim 9, wherein the first N-type transistor and the second N-type transistor are medium voltage devices.

11. The level shifting circuit as claimed in claim 8, wherein the first second-type level shifter comprises:
a first P-type transistor, wherein a source terminal of the first P-type transistor receives the second power supply voltage, a drain terminal of the first P-type transistor is connected with a first node, and a gate terminal of the first P-type transistor is connected with a second node;
a second P-type transistor, wherein a source terminal of the second P-type transistor receives the second power supply voltage, a drain terminal of the P-type transistor is connected with the second node, and a gate terminal of the second P-type transistor is connected with the first node;
an inverter, wherein an input terminal of the inverter is connected with the input terminal of the first second-type level shifter;
a first N-type transistor, wherein a drain terminal of the first N-type transistor is connected with a third node, a source terminal of the first N-type transistor receives the ground voltage, and a gate terminal of the first N-type transistor is connected with the input terminal of the inverter;
a second N-type transistor, wherein a drain terminal of the second N-type transistor is connected with a fourth node, a source terminal of the second N-type transistor receives the ground voltage, and a gate terminal of the second N-type transistor is connected with the output terminal of the inverter;
a third N-type transistor, wherein a drain terminal of the third N-type transistor is connected with the first node, a source terminal of the third N-type transistor is connected with the third node, and a gate terminal of the third N-type transistor receives the at least one bias voltage; and
a fourth N-type transistor, wherein a drain terminal of the fourth N-type transistor is connected with the second node, a source terminal of the fourth N-type transistor is connected with the fourth node, and a gate terminal of the fourth N-type transistor receives the at least one bias voltage,
wherein the second node is connected with the output terminal of the first second-type level shifter, and the third N-type transistor and the fourth N-type transistor are collaboratively formed as the first bias circuit of the first second-type level shifter.

12. The level shifting circuit as claimed in claim 11, further comprising a third P-type transistor, wherein a source terminal of the third P-type transistor receives the second power supply voltage, a drain terminal of the third P-type transistor is connected with the first node or the second node, and a gate terminal of the third P-type transistor is served as an initial terminal of the first second-type level shifter.

13. The level shifting circuit as claimed in claim 11, wherein the first N-type transistor and the second N-type transistor are low voltage devices.

14. The level shifting circuit as claimed in claim 1, wherein the level shifting circuit further comprises a second input terminal and a second output terminal, the second input terminal of the level shifting circuit receives a second mode signal in the first power domain, the second output terminal of the level shifting circuit generates a shifted second mode signal in the second power domain, and the level shifting circuit further comprises:
a second first-type level shifter, wherein an input terminal of the second first-type level shifter is coupled to the second input terminal of the level shifting circuit, the input terminal of the second first-type level shifter receives the second mode signal, and an output terminal of the second first-type level shifter outputs a third shifted signal in the second power domain;
a second second-type level shifter, wherein an input terminal of the second second-type level shifter is coupled to the second input terminal of the level shifting circuit, the input terminal of the second second-type level shifter receives the second mode signal, and an output terminal of the second second-type level shifter outputs a fourth shifted signal in the second power domain, wherein the second second-type level shifter comprises a second bias circuit, and the second bias circuit receives the at least one bias voltage; and
the controller coupled to the output terminal of the second first-type level shifter and the output terminal of the second second-type level shifter,
wherein in a deep standby mode, both of the first mode signal and the second mode signal are in the first logic level state, the first second-type level shifter and the second second-type level shifter are disabled by the controller, and the controller does not provide the at least one bias voltage to the first second-type level shifter and the second second-type level shifter, wherein according to the first shifted signal in the first logic level state, the controller outputs the shifted first mode signal in the first logic level state, wherein according to the third shifted signal in the first logic level state, the controller outputs the shifted second mode signal in the first logic level state,
wherein in a standby mode, the second mode signal is in the second logic level state, the second second-type level shifter is disabled by the controller, and the controller does not provide the at least one bias voltage to the second second-type level shifter, wherein according to the third shifted signal in the second logic level state, the controller outputs the shifted second mode signal in the second logic level state,
wherein in the non-standby mode, the second mode signal is in the second logic level state, the third shifted signal from the second first-type level shifter is ignored by the controller, and the controller enables the second second-type level shifter and provides the at least one bias voltage to the second second-type level shifter, wherein according to the fourth shifted signal in the second logic level state, the controller outputs the shifted second mode signal in the second logic level state.

15. The level shifting circuit as claimed in claim 14, wherein the controller further comprises:
- a delay element, wherein the delay element comprises an output terminal and an input terminal;
- a first latch, wherein an input terminal of the first latch is coupled to the output terminal of the first first-type level shifter, and a reset terminal of the first latch is coupled to the output terminal of the delay element;
- a first OR gate, wherein a first input terminal of the first OR gate is coupled to an output terminal of the first latch, a second input terminal of the first OR gate is coupled to the output terminal of the first second-type level shifter, an output terminal of the first OR gate is coupled to the input terminal of the delay element, and the output terminal of the first OR gate is served as the first output terminal of the level shifting circuit;
- a bias voltage generator, wherein an enable terminal of the bias voltage generator is coupled to the output terminal of the first OR gate;
- a second latch, wherein an input terminal of the second latch is coupled to the output terminal of the second first-type level shifter, and a reset terminal of the second latch is coupled to the output terminal of the delay element; and
- a second OR gate, wherein a first input terminal of the second OR gate is coupled to an output terminal of the second latch, a second input terminal of the second OR gate is coupled to the output terminal of the second second-type level shifter, and an output terminal of the second OR gate is connected with the second output terminal of the level shifting circuit,
- when the bias voltage generator is enabled, the bias voltage generator provides the at least one bias voltage to the first bias circuit of the first second-type level shifter and the second bias circuit of the second second-type level shifter, wherein when the bias voltage generator is disabled, the bias voltage generator does not provide the at least one bias voltage to the first bias circuit of the first second-type level shifter and the second bias circuit of the second second-type level shifter.

16. The level shifting circuit as claimed in claim 15, wherein the output terminal of the delay element is coupled to the reset terminal of the first latch and the reset terminal of the second latch through an AND gate, wherein a first input terminal of the AND gate is connected with the output terminal of the delay element, a second input terminal of the AND gate is connected with the output terminal of the second OR gate, an output terminal of the AND gate is connected with the reset terminal of the first latch and the reset terminal of the second latch.

17. The level shifting circuit as claimed in claim 16, wherein in the deep standby mode, the first latch outputs a first latch output signal in the first logic level state, the first OR gate outputs the shifted first mode signal in the first logic level state, the second latch outputs a second latch output signal in the first logic level state, the second OR gate outputs the shifted second mode signal in the first logic level state, and the delay element outputs a delay output signal in the first logic level state, so that the first latch and the second latch are not reset, wherein according to the shifted first mode signal in the first logic level state, the first second-type level shifter, the second second-type level shifter and the bias voltage generator are disabled.

18. The level shifting circuit as claimed in claim 17, wherein when the deep standby mode is switched to the standby mode, the second mode signal is switched from the first logic level state to the second logic level state, the third shifted signal is switched from the first logic level state to the second logic level state, the second latch output signal is switched from the first logic level state to the second logic level state, and the shifted second mode signal is switched from the first logic level state to the second logic level state.

19. The level shifting circuit as claimed in claim 18, wherein when the standby mode is switched to the non-standby mode, the first mode signal is switched from the first logic level state to the second logic level state, the first shifted signal is switched from the first logic level state to the second logic level state, the first latch output signal is switched from the first logic level state to the second logic level state, and the shifted first mode signal is switched from the first logic level state to the second logic level state.

20. The level shifting circuit as claimed in claim 19, wherein according to the shifted first mode signal in the second logic level state, the first second-type level shifter, the second second-type level shifter and the bias voltage generator are enabled, and the bias voltage generator provides the at least one bias voltage to the first second-type level shifter and the second second-type level shifter after the bias voltage generator has been enabled for a start-up time, wherein according to the shifted first mode signal in the second logic level state, the delay element generates the delay output signal in the second logic level state to the first latch and the second latch after a delay time of the delay element, so that the first latch and the second latch are reset, wherein the delay time is longer than or equal to the start-up time.

21. The level shifting circuit as claimed in claim 14, wherein a voltage level of the first mode signal in the first logic level state is a ground voltage, a voltage level of the second mode signal in the first logic level state is the ground voltage, a voltage level of the first mode signal in the second logic level state is a first power supply voltage, and a voltage level of the second mode signal in the second logic level state is the first power supply voltage, a voltage level of the shifted first mode signal in the first logic level state is the ground voltage, a voltage level of the shifted second mode signal in the first logic level state is the ground voltage, a voltage level of the shifted first mode signal in the second logic level state is a second power supply voltage, and a voltage level of the shifted second mode signal in the second logic level state is the second power supply voltage.

* * * * *